United States Patent [19]
Abe et al.

[11] Patent Number: 5,198,999
[45] Date of Patent: Mar. 30, 1993

[54] SERIAL INPUT/OUTPUT SEMICONDUCTOR MEMORY INCLUDING AN OUTPUT DATA LATCH CIRCUIT

[75] Inventors: Katsumi Abe, Yokohama; Kaoru Nakagawa, Kawasaki; Hiroyuki Koinuma, Yokohama, all of Japan

[73] Assignee: Kabushiki Kaisha Toshiba, Kawasaki, Japan

[21] Appl. No.: 754,170

[22] Filed: Sep. 4, 1991

Related U.S. Application Data

[63] Continuation of Ser. No. 405,884, Sep. 11, 1989, abandoned.

[30] Foreign Application Priority Data

Sep. 12, 1988 [JP]   Japan ................................ 63-228060

[51] Int. Cl.[5] ..................... G11C 19/00; G11C 11/407; G11C 11/413
[52] U.S. Cl. ............................... 365/189.05; 365/221; 365/189.12; 365/233; 365/189.09; 377/78; 377/67
[58] Field of Search ....................... 365/78, 74, 189.05, 365/221, 233, 239, 240, 189.09, 189.12; 377/64, 67, 77, 78, 79

[56] References Cited

U.S. PATENT DOCUMENTS

| | | | |
|---|---|---|---|
| 3,691,538 | 9/1972 | Haney et al. | 365/189.12 |
| 4,697,279 | 9/1987 | Baratti et al. | 377/73 |
| 4,733,376 | 3/1988 | Ogawa | 365/221 |
| 4,779,234 | 10/1988 | Kaneko et al. | 365/221 |
| 4,856,034 | 8/1989 | Takeuchi et al. | 377/74 |
| 4,860,327 | 8/1989 | Nakagawa et al. | 377/79 |
| 4,903,242 | 2/1990 | Hamaguchi et al. | 365/189.12 |
| 4,912,680 | 3/1990 | Masaki et al. | 365/189.12 |

FOREIGN PATENT DOCUMENTS

| | | |
|---|---|---|
| 0171518 | 2/1986 | European Pat. Off. |
| 0224004 | 6/1987 | European Pat. Off. |

*Primary Examiner*—Glenn Gossage
*Attorney, Agent, or Firm*—Finnegan, Henderson, Farabow, Garrett and Dunner

[57] ABSTRACT

A semiconductor memory has an output data latch circuit controlled in response to a clock signal shifted by a half period from a control clock input to n one-bit shift register stages. The memory device includes a plurality of read data latch circuits, as well as a plurality of write or address data latch circuits, coupled to the n one-bit shift register stages and to a plurality of selector or multiplexor circuits. A noise filter is inserted in a clock input supply path to the n one-bit shift register stages but is not inserted in a clock input supply path to the output data latch circuit.

6 Claims, 12 Drawing Sheets

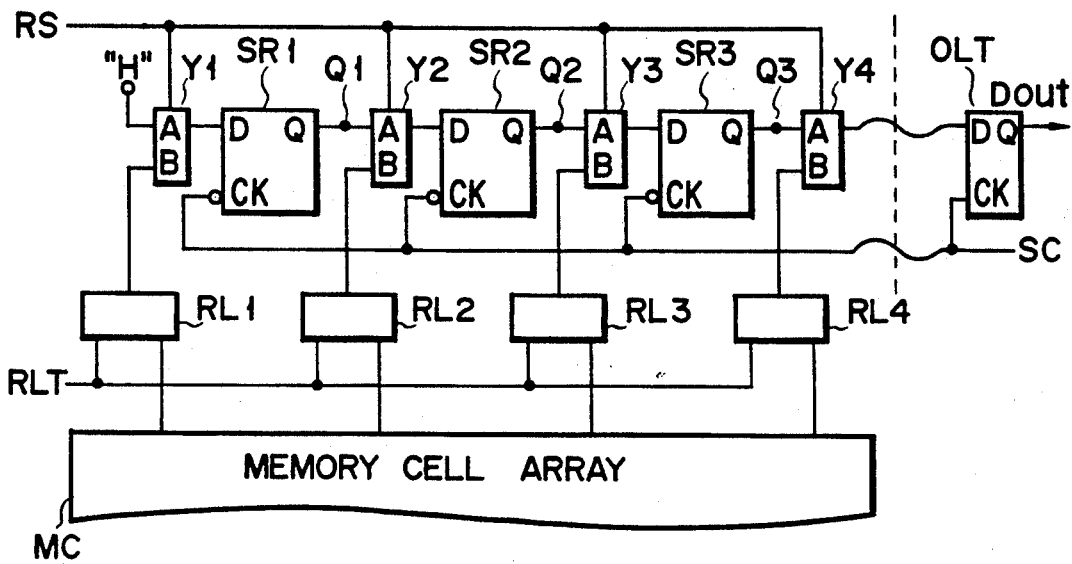
F I G. 11
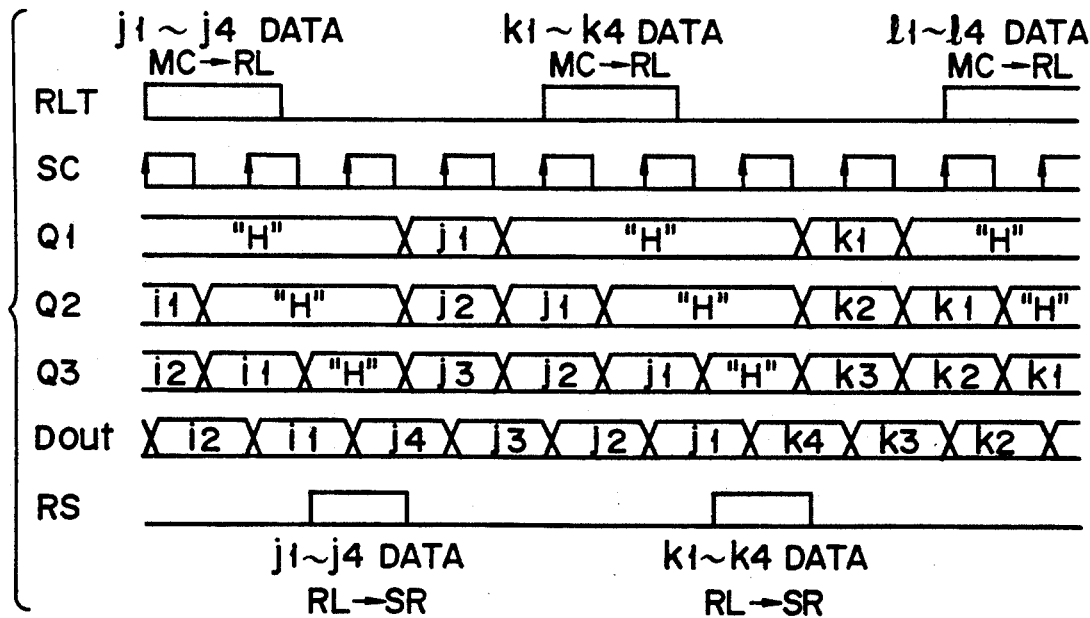
F I G. 12

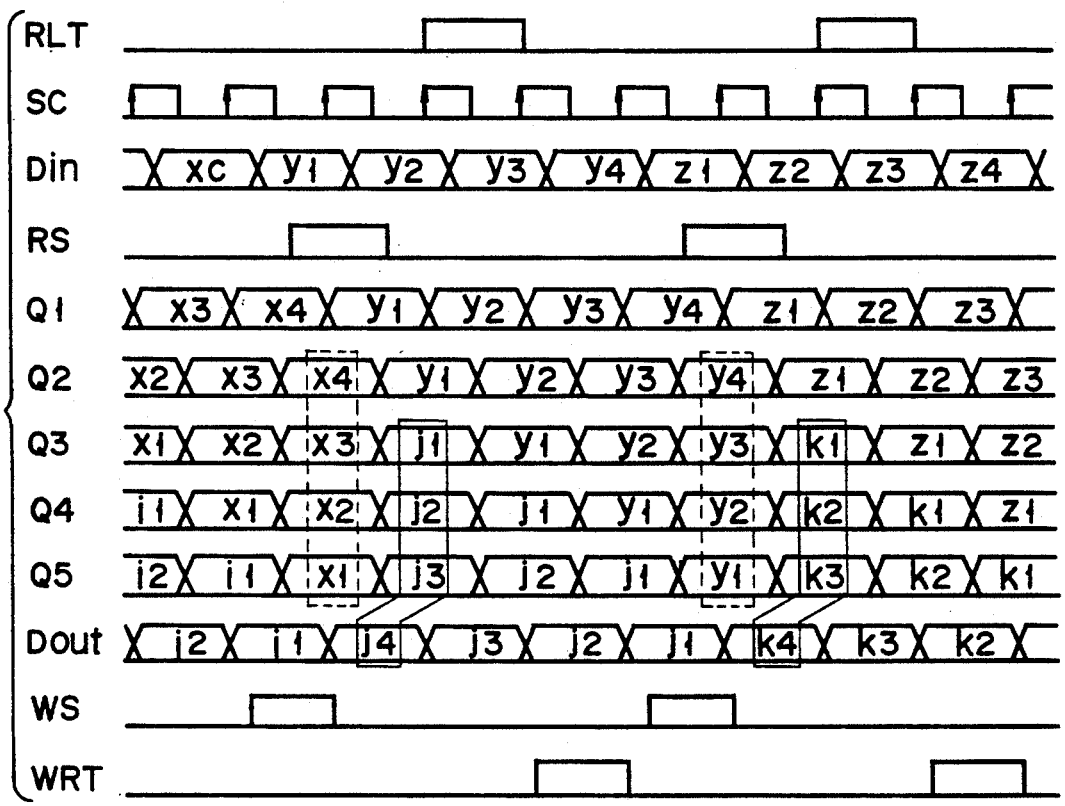
F I G. 14

SERIAL INPUT/OUTPUT SEMICONDUCTOR MEMORY INCLUDING AN OUTPUT DATA LATCH CIRCUIT

This application is a continuation of application Ser. No. 07/405,884, filed Sept. 11, 1989, now abandoned.

BACKGROUND OF THE INVENTION

1. Field of the Invention

The present invention relates to a semiconductor memory including a serial data output control circuit, such as an image memory.

2. Description of the Related Art

In recent years, strong demand for achieving a high-speed operation of a semiconductor memory has arisen in various fields, and the demand for a semiconductor memory capable of serial access has increased. Such a conventional semiconductor memory, e.g., an image memory, includes a random access memory section (hereinafter called a RAM section) capable of performing random access, and a serial access memory section (hereinafter called a SAM section) capable of performing serial access. Data are transferred between the RAM and SAM sections through read and write latch sections, and asynchronous access of the RAM and SAM sections is performed.

The RAM section has the same arrangement as that of a conventional dynamic or static memory. An access method of the RAM section is substantially the same as in the dynamic or static memory. The SAM sections are classified into two types. One is a section for serially transferring data in practice using a shift register. The other one is a section for realizing serial access by sequentially accessing the read and write latch sections. In this case, the former section using a shift register will be described below.

FIG. 1 shows an arrangement of an image memory using shift registers in serial input and output section, respectively. Reference symbol SRi denotes an input shift register; WL, a write latch section; MC, a memory cell array; RL, a read latch section; SRo, an output shift register; RAMC, a RAM control circuit; AD, an address decoder; SAMC, a SAM control circuit; $\overline{CE}$, a control signal for the RAM section; $\overline{WE}$, a write/read control signal for the RAM section; Din, write data to be serially input; Dout, readout data to be serially output; SC, a control clock input for the SAM section; and WS, a signal for controlling a data transfer operation from the input shift register SRi to the write latch section WL.

FIG. 2 shows an arrangement of the serial input section constituted by, e.g., four shift registers SR1 to SR4. FIG. 3 is a timing chart of the serial input section shown in FIG. 2. The serial input data Din are sequentially received by the shift registers SR1 to SR4 in response to the clock input SC, and are respectively written in write latches WL1 to WL4 in response to the signal WS every 4-bit input. These data are written into a memory cell array in response to a signal WRT prior to writing of new data in the write latches WL1 to WL4 in response to a next output signal WS. The signal WRT is formed from the control signals $\overline{CE}$ and $\overline{WE}$ for the RAM section. The signal WRT allows a write operation to the memory cell array while being asynchronous with the clock input SC and the signal WS.

FIG. 4 shows an arrangement of the serial output section constituted by, e.g., four shift registers SRI to SR4. FIG. 5 is a timing chart of the serial output section shown in FIG. 4. Data in the memory cell array are read out and latched by read latches RL1 to RL4 in response to a signal RLT formed by the control signals $\overline{CE}$ and $\overline{WE}$ for the RAM section. Then, outputs from the read latches RL1 to RL4 are respectively selected by selectors Y1 to Y4 in response to the signal RS, and the selected outputs are sequentially received by the shift registers SR1 to SR4 at a leading edge of the clock input SC. The received outputs are sequentially output from the shift register SR4 as serial output data Dout. In the same manner as in the serial input operation, the signal RLT can read the contents of the memory cells and stores the readout data in the read latches RL1 to RL4 while being asynchronous with the clock input SC before the signal RS is output.

In the image memory shown in FIG. 1, the serial input and output sections may be preferably arranged adjacent to the memory cell array. In this case, a relatively long wiring is required to connect the serial input and output sections to the external clock input SC and the serial input data Din, and the external serial output data Dout. In particular, as shown in FIGS. 6 and 7, in the serial output section, if a wiring delay that cannot be neglected occurs in a wiring L between the clock input SC and the serial output data Dout, a serial access time is adversely prolonged. Reference symbol Bi denotes an SC clock input buffer; Bo, a data output buffer; and SR4, a last shift register.

A serial access time required for the image memory is 10 ns to, 20 ns. This serial access time must be even shorter for, e.g., a high-quality television receiver with a large screen size which uses an image memory. As memory capacity increases, an increased wiring delay further increases an access time.

On the other hand, an image memory has a larger capacity and a larger number of high-speed serial ports, e.g., a television receiver which has high quality and a larger screen size and which uses an image memory. In the image memory shown in FIG. 1, the serial input and output sections may be preferably arranged adjacent to the memory cell array. If the serial input and output sections are arranged adjacent to the memory cell array, the layout of the peripheral sections of the memory cell array becomes difficult, and a chip size and the number of external signal pins are undesirably increased along with the development of a high-capacity and multibit image memory.

More specifically, in order to achieve a highspeed operation, the number of shift registers must be increased because of the restriction of a read/write cycle of the RAM section. The number of shift registers is increased as the number of ports is increased, and the number of bits is also increased when the RAM section has a larger capacity. Therefore, a 4-bit image memory having three independent serial I/O ports requires 24 shift registers. In this case, a large number of external signal pins are required to perform control and input-/output operations of the serial section, except for the external signal pins required for the RAM section.

When a multibit, high-speed serial port is developed, an external load of the semiconductor integrated circuit becomes large. As a result, a charge/discharge current is increased, and a variation (to be referred to as output noise hereinafter) in power source or ground potential is increased. In a serial access memory, a high-impedance period of an output does not exist, and data are continuously output. Therefore, a voltage amplitude of an output and its time change dV/dt are large in comparison to those in a conventional random access memory.

Therefore, output noise is further increased, and operations of the circuits in the memory may be adversely affected.

FIG. 8 is a timing chart of an operation when the potential of the clock input SC is changed due to output noise in the circuit in the serial output section shown in FIG. 4. More specifically, when the clock input SC goes to level "H" from level "L", the output Dout is switched, and the external load is charged or discharged at this time. Therefore, the ground potential of the integrated circuit varies. Therefore, in the integrated circuit, the potential of the clock input SC seems to be changed when the output Dout is switched, as shown in FIG. 8. In addition, when the output Dout goes to level "H" from level "L", i.e., when the electric charges in the external load are discharged to the ground potential in the integrated circuit, an adverse effect due to the output noise becomes more noticeable.

The registers SR1 to SR4 hold and output data of the immediately preceding cycle when the clock SC is set at level "L". In addition, the registers SR1 to SR4 receive outputs from the selectors Y1 to Y4, through.. the input terminals thereof, output the data, that is received when the clock SC is set at level "H", and invalidate the data input to the input terminals.

At a trailing edge of the output Dout, electric charges are discharged from the external load capacitor to ground, and hence the ground potential of the semiconductor memory is temporarily increased. At this time, all the potentials in the semiconductor memory are determined with reference to the internal ground potential. Therefore, the external clock input SC seems to be "L" at this moment (shown surrounded by a broken line in FIG. 8). Therefore, the shift registers SR1 to SR4 receive new data during a period of time when input data is to be invalidated, and an output is switched. In other words, a data transfer error undesirably occurs.

FIG. 9 shows a circuit in which a noise filter NF is inserted in a supply path of the clock input SC, to suppress the above-mentioned variation in potential of the clock input SC due to output noise. An example of operation waveforms obtained when such an arrangement is employed are shown in FIG. 10. Even if the potential of the clock input SC varies due to the output noise, a potential variation in clock input SC' passed through the noise filter NF is suppressed. Therefore, a data transfer error of the shift registers SR1 to SR4 can be prevented.

Since the clock input SC' is delayed from the clock input SC by a delay time of the noise filter, timings of a data transfer operation of the shift registers SR1 to SR4 are delayed as compared with a case wherein the noise filter NF is not inserted. More specifically, in the circuit shown in FIG. 9, a serial access time (time until the output Dout is switched from a leading edge of the clock input SC) is undesirably delayed as a side effect of prevention of an operation error of the circuit due to output noise.

SUMMARY OF THE INVENTION

It is an object of the present invention to provide a semiconductor memory capable of performing high-speed serial access without a direct effect on a serial access time due to a wiring delay caused between a control clock input and serial output data.

It is another object of the present invention to provide a semiconductor memory which allows easy layout of peripheral sections of a memory cell array, and prevents an increase in chip size and the number of external signal pins.

It is still another object of the present invention to provide a semiconductor memory which can prevent an operation error of a serial output port due to output noise without adversely prolonging a data access time.

A semiconductor memory according to a first embodiment of the present invention having an output port capable, of performing serial access has shift registers used in the serial output port. A last shift register connected to an output stage is replaced by an output data latch circuit, and the output data latch circuit is controlled in response to a clock signal shifted from a control clock input to the shift register by a half period.

A semiconductor memory according to a second embodiment of the present invention comprises a read data latch circuit for temporarily holding data read out from a memory cell array in correspondence with the shift register and the output data latch circuit, in the semiconductor memory according to the first embodiment.

A semiconductor memory according to a third embodiment of the present invention comprises an input/output port capable of performing serial access. One serial shift register is commonly used for the input/output ports, a last shift register of the shift resisters which is connected to an output stage is replaced by an output data latch circuit, and the output data latch circuit is controlled in response to a clock signal shifted from a control clock input to the shift register by a half period.

In a semiconductor memory according to a fourth aspect of the present invention the serial input data is latched as a read address of the memory cell, and the latched data is used as an internal address, in the semiconductor memory according to the third embodiment.

In a semiconductor memory according to a fifth embodiment of the present invention a noise filter is inserted in a clock input supply path to each 1-bit shift register, and is not inserted in a clock input supply path to the output data latch circuit, in the semiconductor memories according to the first to fourth embodiments.

In the semiconductor memory according to the first embodiment, data can be transferred from the memory cell to the serial output port shift register prior to outputting of the data by the output data latch circuit by a half period of the control clock. Thus, a high-speed serial access operation can be performed without an adverse effect due to a wiring delay caused between the control clock input and the serial output data.

In the semiconductor memory according to the second embodiment, when data read out from the memory cell is temporarily held by the read data latch circuit, the serial output section is separated from the memory cell array. The memory cell can be precharged at the same time that serial output operation is performed, and a cycle time of the serial output can be decreased.

In the semiconductor memories according to the third and fourth embodiments, the number of shift registers is halved in comparison to the case where independent shift registers are respectively used in the input and output ports. Therefore, easy layout of peripheral section of the memory cell array can be achieved and the chip size can be reduced. In addition, an external address can be serially input, and an external address pin is not required. As a result, a package size can be decreased, and a packaging density can be greatly increased.

In the semiconductor memory according to the fifth embodiment, since the noise filter is not inserted in the clock input supply path of the output data latch circuit, a data access time is not adversely prolonged. Since the noise filter is inserted in the clock input supply path of the 1-bit shift resister, a variation in potential of the clock due to output noise can be suppressed, thus preventing an operation error of the serial output port.

BRIEF DESCRIPTION OF THE DRAWINGS

FIG. 11 is a block diagram of a serial output section of a semiconductor memory according to the present invention;

FIG. 12 is a timing chart of the serial output section shown in FIG. 11;

FIG. 14 is a timing chart of the serial input/output section of the semiconductor memory shown in FIG. 13;

DETAILED DESCRIPTION OF THE PREFERRED EMBODIMENTS

Figure 1:
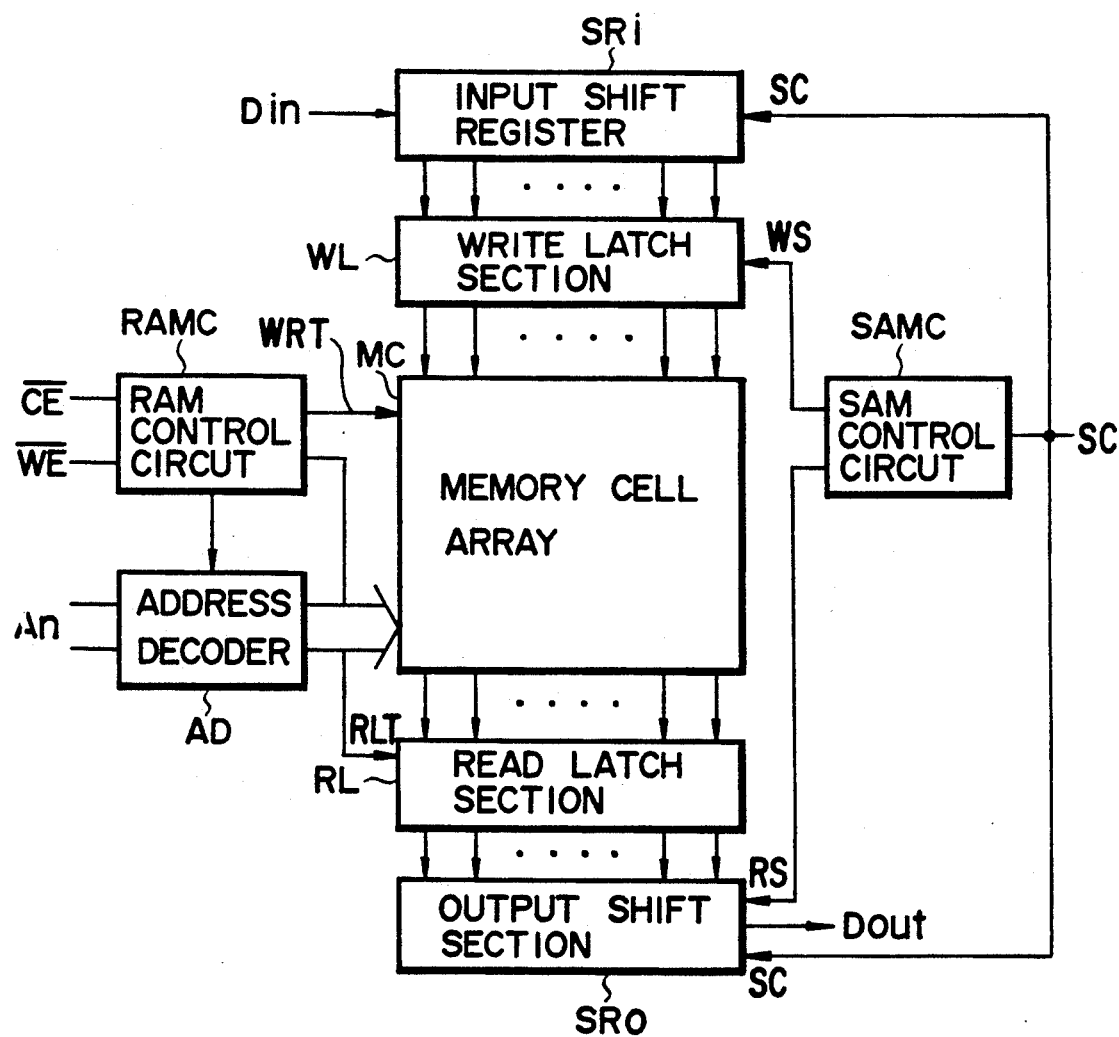
FIG. 1 is a block diagram of a conventional image memory.
Figure 2:
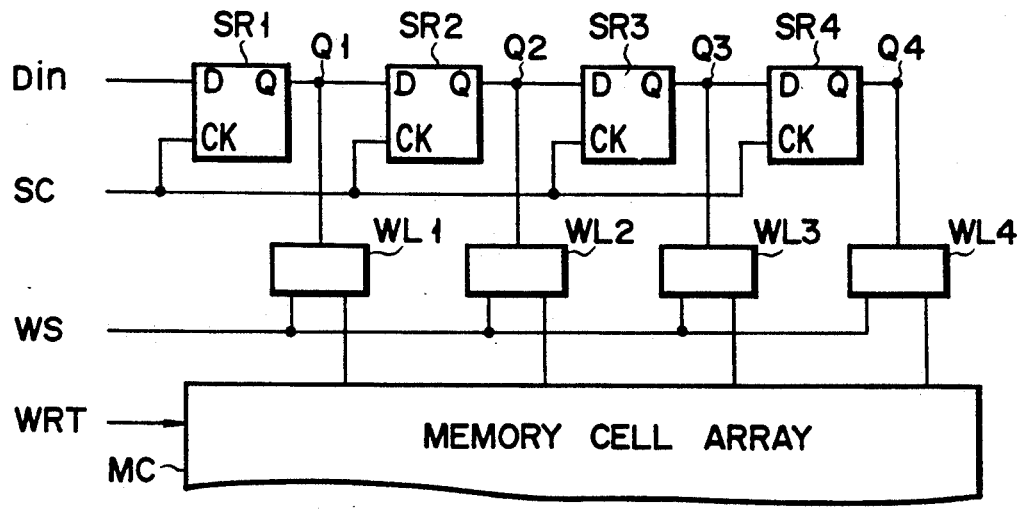
FIG. 2 is a block diagram of a conventional serial input section.
Figure 3:
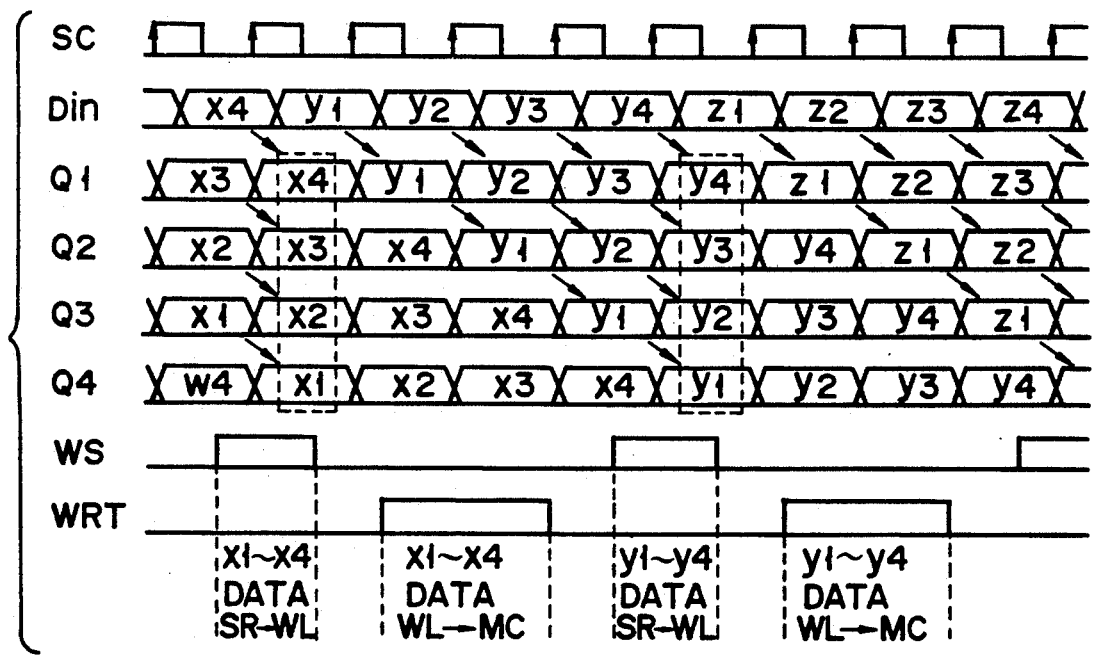
FIG. 3 is a timing chart of the conventional serial input section shown in FIG. 2.
Figure 4:
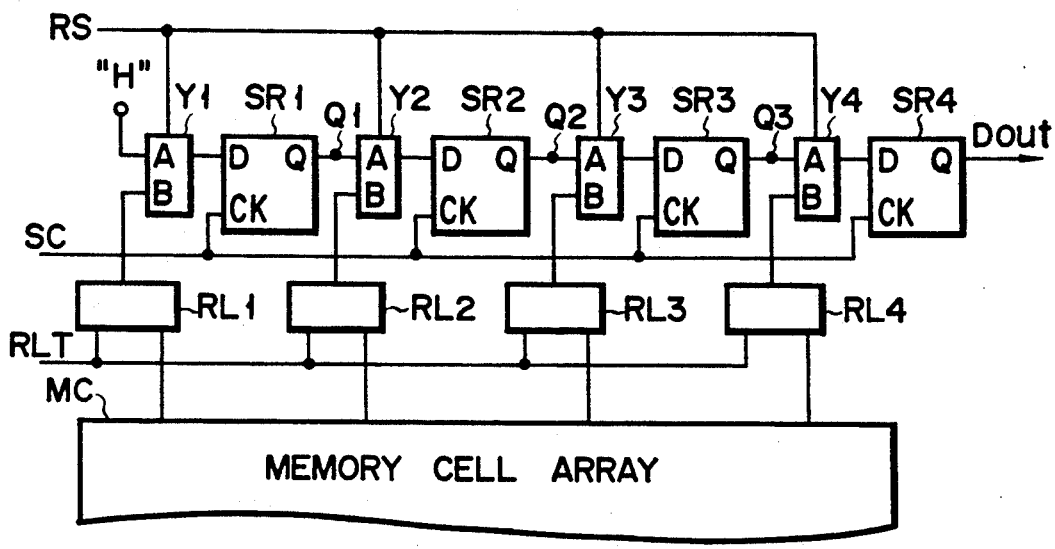
FIG. 4 is a block diagram of a conventional serial output section.
Figure 5:
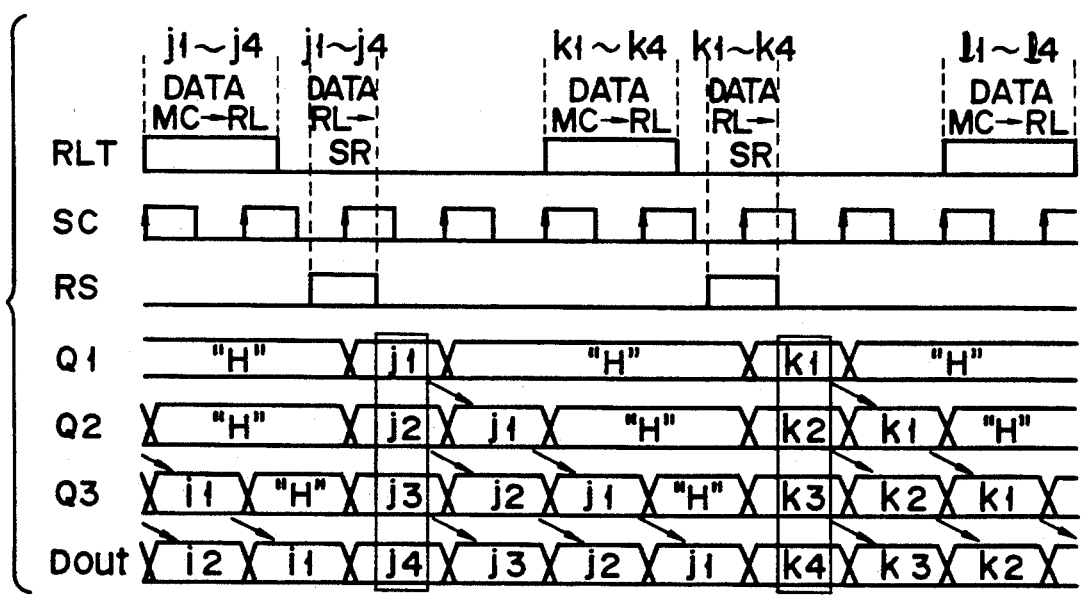
FIG. 5 is a timing chart of the conventional serial output section shown in FIG. 4.
Figure 6:
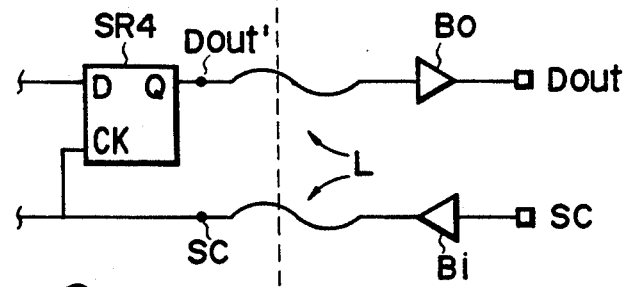
FIG. 6 is a circuit diagram showing a connection state between the conventional serial output section shown in FIG. 4, a clock input buffer, and a data output buffer.
Figure 7:
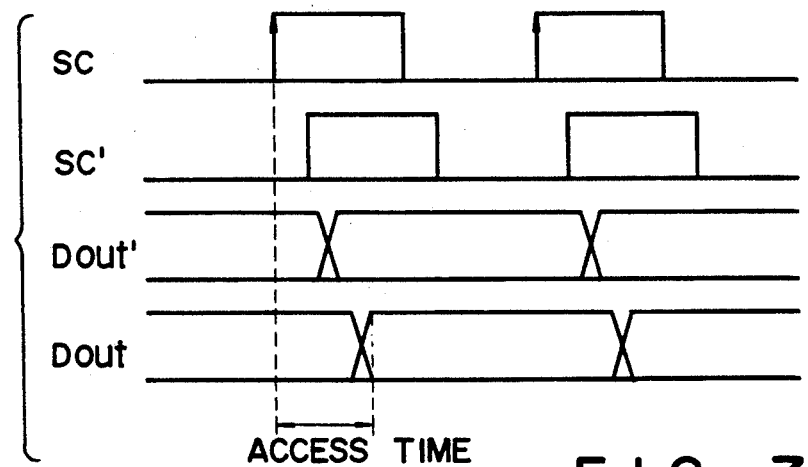
FIG. 7 is a timing chart of the circuit shown in FIG. 6.
Figure 8:
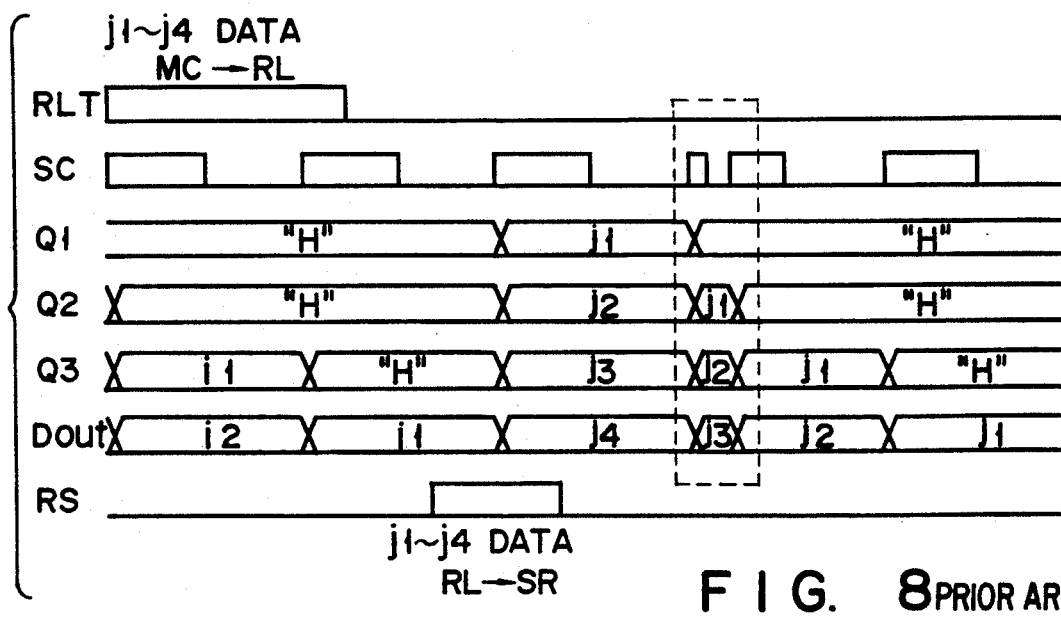
FIG. 8 is a timing chart when the conventional serial output section shown in FIG. 4 is erroneously operated.
Figure 9:
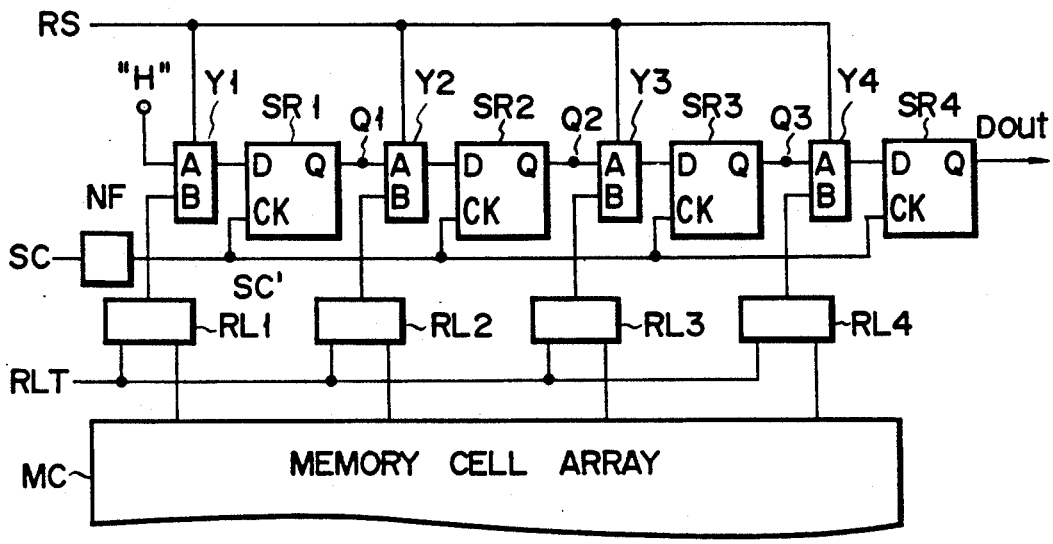
FIG. 9 is a block diagram showing a noise filter added to the conventional serial output section shown in FIG. 4.
Figure 10:
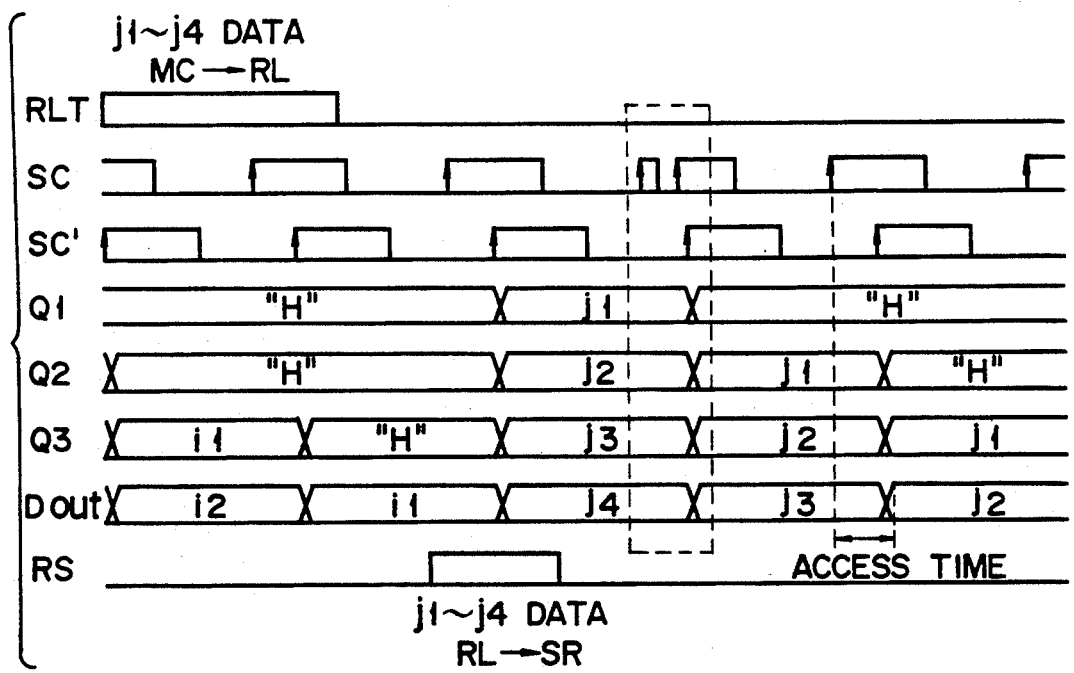
FIG. 10 is a timing chart of the circuit shown in FIG. 9.

An embodiment of the present invention will be described below in detail with reference to the accompanying drawings.

FIG. 11 shows an arrangement of a serial output section in an image memory having an output port capable of performing serial access according to the present invention. In this image memory, the conventional image memory, which has been described above with reference to FIGS. 1 to 5 is modified as follows. In this image memory, a last one of the shift registers used in the serial output port and connected to an output stage is replaced by an output data latch circuit. The output data latch circuit is controlled in response to a clock signal shifted from a control clock for the above-mentioned shift registers by a half period. The remaining arrangement in this image memory is the same as that in the conventional memory.

More specifically, in the serial output section shown in FIG. 11, reference symbols RL1 to RL4 denote read latches for receiving data of a memory cell array when a signal RLT formed by control signals $\overline{CE}$, $\overline{WE}$ for a RAM section is set at "H", and for holding the data read out from the memory cell array when the signal RLT is set at "L", Y1 and Y4 denote selectors for selecting an input terminal A/B in accordance with a level "H"/"L" of a signal RS. The input terminal B of each of the selectors Y1 to Y4 receives an output (each bit of parallel data) from the corresponding one of the read latches RL1 to RL4. The input terminal A of the selector Y1 is set at "H". Reference symbols SR1 to SR3 denote 1-bit shift registers, and are arranged alternately with the selectors Y1 to Y4.

In this case, each of the 1-bit shift registers SR1 to SR3 receives an output selected by the corresponding one of the first to third selectors Y1 to Y3 through each data input terminal D. An output from each of the registers SR1 to SR3 is input to an input terminal A of the corresponding one of the second to fourth selectors Y2 to Y4. When the clock input SC is set at "L", a data transfer operation is performed (data received from the data input terminal D in an immediately preceding cycle of the clock input SC is output and held, and a data input is received from the data input terminal D). When the clock input SC is set at "H", the data received when the clock input SC is set at "L" is output, and the data input to the data input terminal D is invalidated. These read latches RL1 to RL4, the selectors Y1 to Y4, and the shift registers SR1 to SR3 constitute a parallel-to-serial (P/S) converter. This P/S converter is arranged adjacent to the memory cell array.

In addition, an output data latch circuit OLT is arranged in the peripheral circuit section. The output data latch circuit OLT receives an output selected by the last selector Y4 of the selectors Y1 to Y4 through the data input terminal D, receives and outputs the data supplied to the data input terminal D when the clock input SC is set at "H", holds the above-mentioned output data, and invalidates the data input to the data input terminal D when the clock input SC is set at "L".

FIG. 12 is a timing chart of the serial output section in the image memory according to the present invention shown in FIG. 11. In this serial output section, data can be transferred from the memory cell array to the serial output port shift registers SR1 to SR3 prior to outputting of the data by the output data latch circuit OLT by a half period of the control clock input SC. Therefore, even if the P/S converter section is arranged adjacent to the memory cell array, and the output data latch circuit OLT is arranged in the peripheral circuit section, high-speed serial access can be performed without a direct effect on a serial access time due to a wiring delay caused between the clock input SC and serial output data Dout. Therefore, an image memory having a sufficient operation margin can be realized. In addition, a chip size need not be increased.

Figure 13:
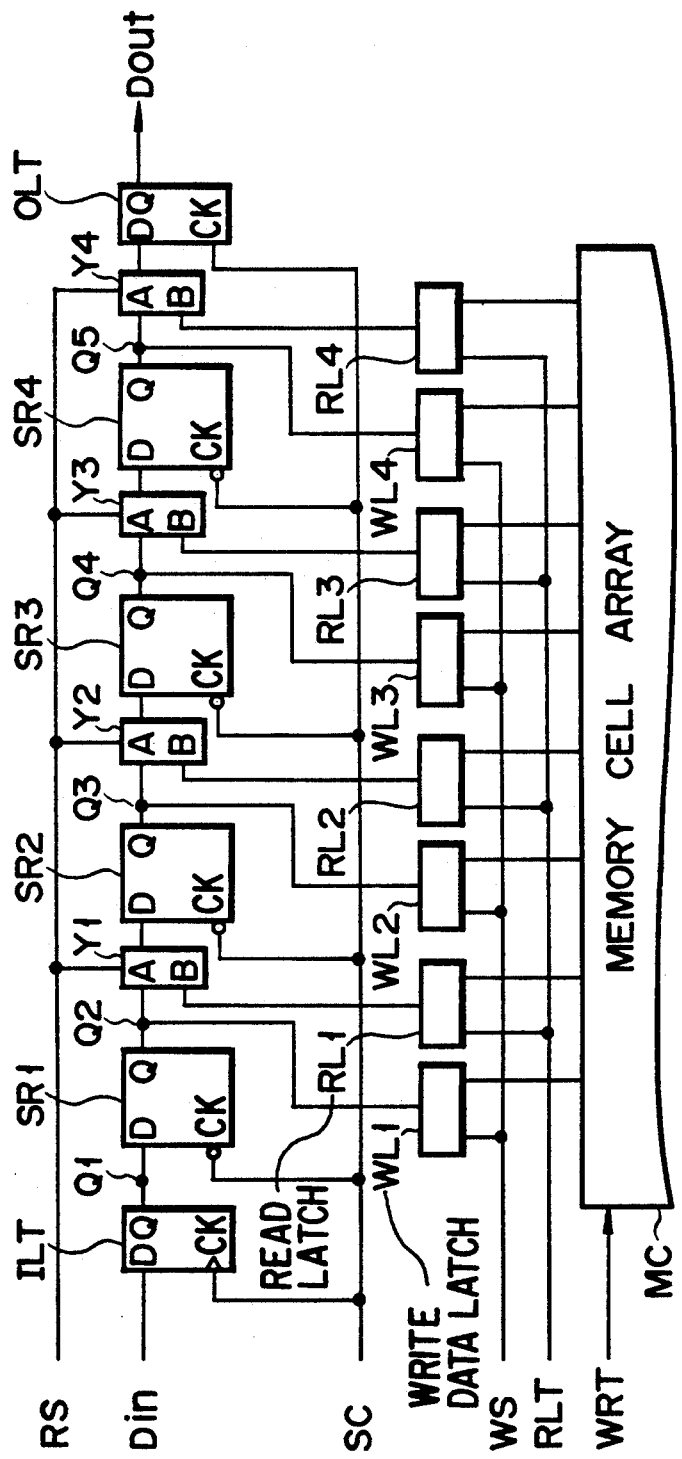
FIG. 13 is a block diagram of a serial input/output section of a semiconductor memory according to the present invention.

FIG. 13 shows an arrangement of the serial input/output section in the image memory having an input/output port capable of performing serial access according to the present invention. In this image memory, the conventional image memory described above with reference to FIGS. 1 to 5 is modified as follows. In this image memory, one-serial shift register is commonly used for the input and output ports, and the last shift register connected to an output stage is replaced by a data latch circuit. This data latch circuit is controlled in response to a clock signal shifted from the control clock for the above-mentioned shift register by a half period. The remaining arrangement of this image memory is the same as that of the conventional image memory.

More specifically, in the serial input/output section shown in FIG. 13, the selectors Y1 to Y4 select the input terminals A/B in accordance with the level "H"/"L" of the signal RS. Reference symbol ILT denotes an input latch circuit for receiving and outputting a data input Din when the clock input SC is set at "H", and holding the above-mentioned output data and invalidating the data input Din when the clock input SC is set at "L"; SR1 to SR4, 1-bit shift registers arranged alternately with the selectors Y1 to Y4.

In this case, an output (write data) from the input latch circuit ILT is input to the data input terminal D of the first 1-bit shift register SR1. An output selected by each of the first to third selectors Y1 to Y3 is input to the data input terminal D of the corresponding one of the second to fourth 1-bit shift registers SR2 to SR4. An output from each of the 1-bit shift registers SR1 to SR4 is input to the data input terminals A of the corresponding one of the first fourth selectors Y1 to Y4. When the clock input SC is set at "L", the input latch circuit ILT holds and outputs the data received from the data input terminal D in an immediately preceding cycle of the clock input SC, and receives the data input to the data input terminal D. When the clock input SC is set at "H", the input latch circuit ILT outputs the data received when the clock input SC is set at "L", and invalidates the data input to the data input terminal D.

Four read data latch circuits RL1 to RL4 corresponding to the four selectors Y1 to Y4 receive bits (data read out from the memory cell array) of parallel data through the data input terminals, respectively. Outputs from the read data latch circuits RL1 to RL4 are input to the data input terminals B of the selectors Y1 to Y4, respectively. Each of the read data latch circuits RL1 to RL4 outputs the data read out from the memory cell array which is supplied to the corresponding data input terminal when the read control signal RLT formed by the control signals CE, WE, and the like for the RAM section is set at "H", and holds the output data and invalidates the data input to the corresponding data input terminal when the read control signal RLT is set at "L".

Four write data latch circuits WL1 to WL4 corresponding to the four 1-bit shift registers SR1 to SR4 receive outputs from the 1-bit shift registers SR1 to SR4 through the data input terminals, respectively. Each of the four write data latch circuits WL1 to WL4 outputs data supplied to the corresponding data input terminal when the write control signal WS is set at "H", and holds the output data and invalidates the data input to the corresponding data input terminal when the write control signal WS is set at "L".

These read data latch circuits RL1 to RL4, the write data latch circuits WL1 to WL4, the selectors Y1 to Y4, the input latch circuit ILT, and the shift registers SR1 to SR4 constitute a parallel-to-serial (P/S) converter. This P/S converter is arranged adjacent to the memory cell array.

In addition, the output data latch circuit OLT is arranged in the peripheral circuit section. The output data latch circuit OLT receives an output selected by the last selector Y4 of the selectors Y1 to Y4 through the data input terminal D, receives and outputs the data supplied to the data input terminal D when the clock input SC is set at "H", holds the above-mentioned output data, and invalidates the data input to the data input terminal D when the clock input SC is set at "L".

FIG. 14 is a timing chart of the serial input/output section in the image memory according to the present invention shown in FIG. 13. In this serial input/output section, external inputs can be continuously input to write the inputs in the memory cell array. At the same time, data read out from the memory cell array can be externally and continuously output. In this case, when the data read out from the read data latch circuits RL1 to RL4 are directly supplied to the first to fourth shift registers SR1 to SR4, contention between a write operation of the input data to the write data latch circuits WL1 to WL4 and a read operation of the output data to the shift registers SR1 to SR4 can be prevented.

Since data is transferred from the memory cell array to the serial input/output port shift registers SR1 to SR4 prior to outputting of the data from the data latch circuit OLT by a half period of the control clock input SC, a transient data output error upon switching of the selector can be prevented. In addition, even if the P/S converter section is arranged adjacent to the memory cell array, and the output data latch circuit OLT is arranged in the peripheral circuit section, high-speed serial access can be performed without a direct effect on a serial access time due to a wiring delay caused between the SC clock input and the serial output data Dout.

In the above-mentioned serial input/output section, the number of shift registers used in the input/output port is halved as compared with a case wherein independent shift registers are respectively used for the input and output ports. Therefore, easy layout of peripheral sections of the memory cell array can be achieved, and a chip size can be decreased.

More specifically, in the serial input/output section shown in FIG. 13, even if the serial input/output section is arranged adjacent to the memory cell array, easy layout of peripheral sections of the memory cell array can be achieved, and increases in chip size and the number of external signal pins can be prevented. Therefore, a multibit image memory having a larger capacity and a large number of high-speed ports can be realized.

Figure 15:
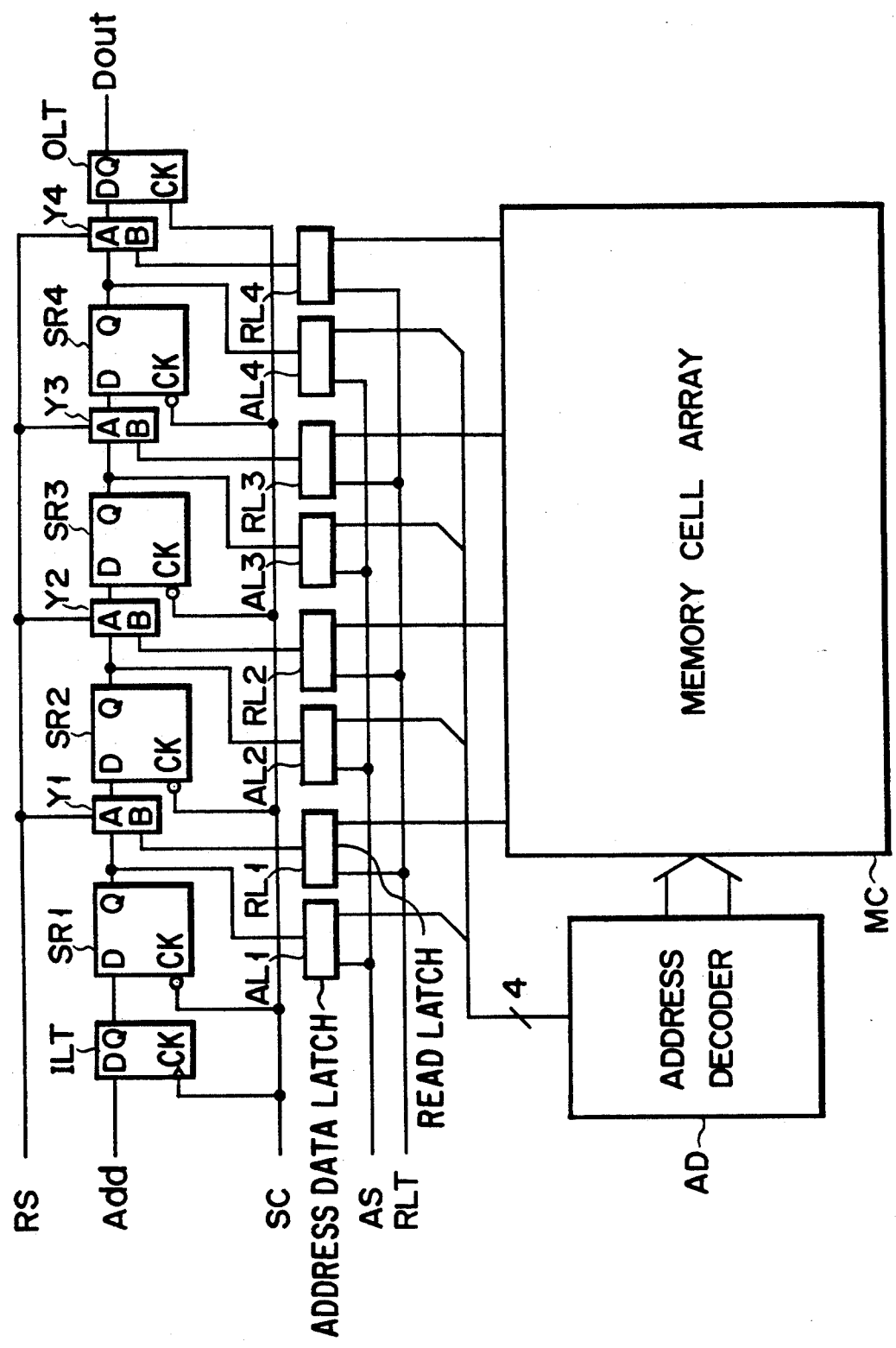
FIG. 15 is a block diagram of the serial input/output section of the semiconductor memory according to the present invention.

FIG. 15 shows a modification of the memory shown in FIG. 13. In FIG. 15, the memory shown in FIG. 13 is modified as follows. In the memory shown in FIG. 15, a memory cell read address Add is serially input in place of the write data input Din to the input latch circuit ILT in FIG. 13. In this memory, four address data latch circuits AL1 to AL4 are arranged in place of the four write data latch circuits WL1 to WL4. The address data latch circuits AL1 to AL4 receive outputs from the 1-bit shift registers SR1 to SR4 through the data input terminals, respectively, output data supplied to the data input terminals when an address latch control signal AS is set at "H", and hold the output data and invalidate the data input when the address latch control signal AS is set at "L". The outputs from the four address data latch circuits AL1 to AL4 are input to an address decoder AD as an internal address.

Thus, since the external address ADD can be serially input, the external address pin is not required. Therefore, a package size can be decreased, and a packing density can be greatly increased.

Figure 16:
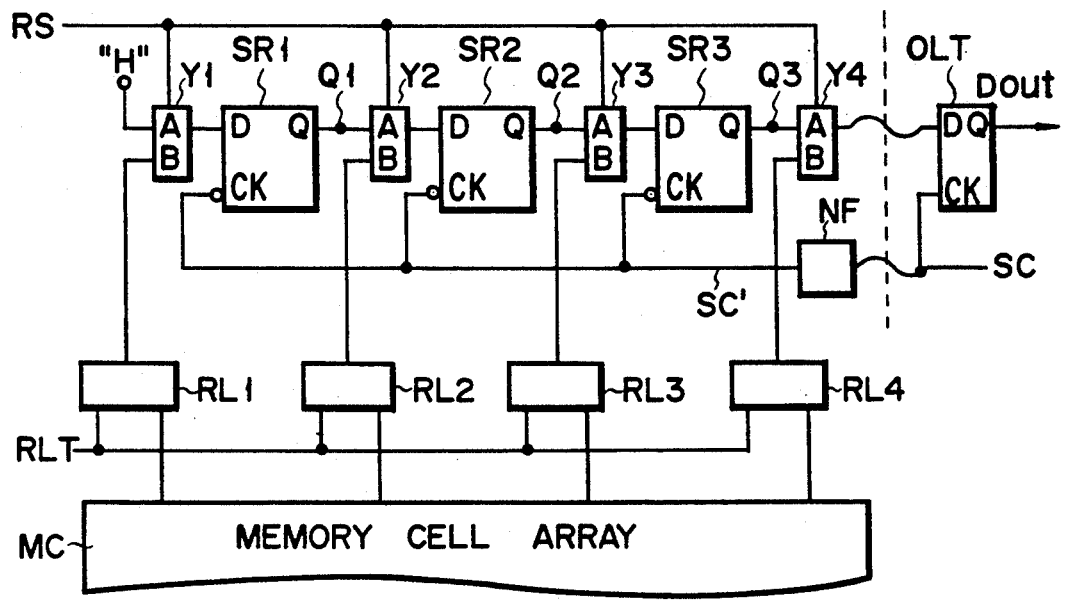
FIG. 16 is a block diagram of a circuit obtained by adding a noise filter in the serial input/output section of the semiconductor memory shown in FIG. 11.

FIG. 16 shows a noise filter NF added to the serial output section shown in FIG. 11. The noise filter NF is inserted in only a clock input supply path to the shift registers SR1 to SR3, and is not inserted in a clock input supply path to the output data latch circuit OLT.

In the arrangement shown in FIG. 16, as described above, electric charges flow into ground in the semiconductor memory from the external load capacitor when the serial data output Dout falls. Therefore, the potential of the clock SC is temporarily decreased. When the serial data output Dout rises, electric charges flow toward the external load capacitor from a power source in the semiconductor memory. Therefore, the power source potential is temporarily decreased. At this time, a ground potential is also decreased due to a parasitic capacitance between the internal power source and ground, and the external input SC seems to be temporarily increased. However, an influence of output noise is more remarkable when the serial data output Dout falls to an extent caused by the absence of the parasitic capacitance.

Figure 17:
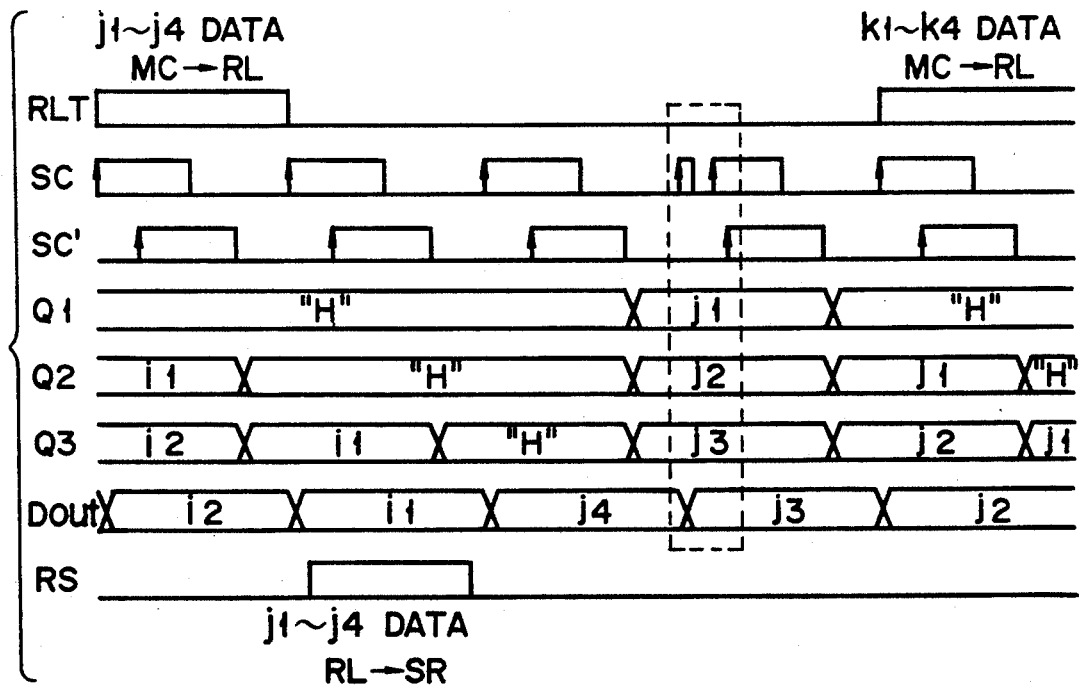
FIG. 17 is a timing chart of the input/output section of the semiconductor memory shown in FIG. 16.

FIG. 17 is a timing chart of the serial output section shown in FIG. 16. More specifically, in the serial output section, even if the potential of the control clock input SC varies due to output noise, a variation in potential of a clock input SC' which passed through the noise filter NF is suppressed.

The shift registers SR1 to SR3 transfer data bit by bit in response to a trailing edge of the clock input SC'. The output data latch circuit OLT receives and outputs an output from the selector Y4 in response to a leading edge of the clock input SC. As shown in a part surrounded by a broken line in FIG. 17, the output data latch circuit OLT tends to receive input data from the data input terminal in response to "L" of the clock input SC when the potential of the clock input SC varies due to output noise. However, the potential of the clock input SC' does not vary at the same timing, and the shift registers SR1 to SR3 do not transfer data. Therefore, an output from the selector Y4 is not changed, and the output data latch circuit OLT receives the same data again. As a result, the serial data output Dout is not changed.

In the serial output section shown in FIG. 16, a serial data access time is not increased, thus preventing an operation error of the serial output port due to output noise.

Figure 18:
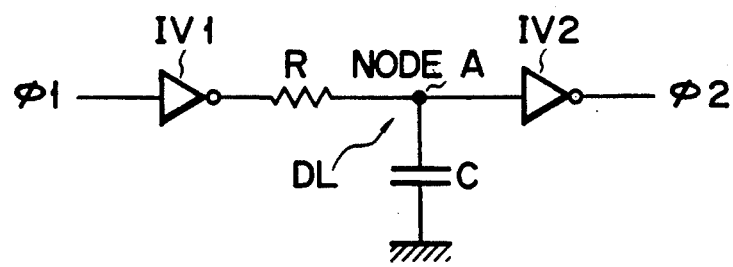
FIG. 18 is a block diagram showing a detailed arrangement of the noise filter shown in FIG. 16.
Figure 20:
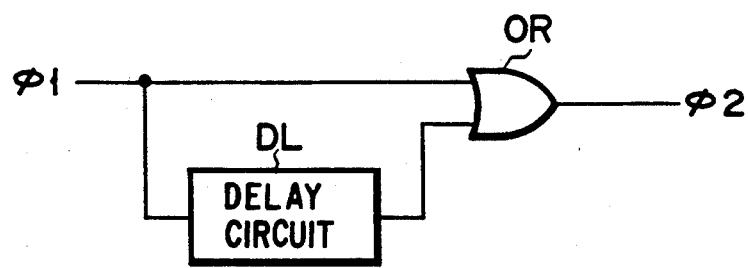
FIG. 20 is a block diagram showing a detailed arrangement of the noise filter shown in FIG. 16.
Figure 22:
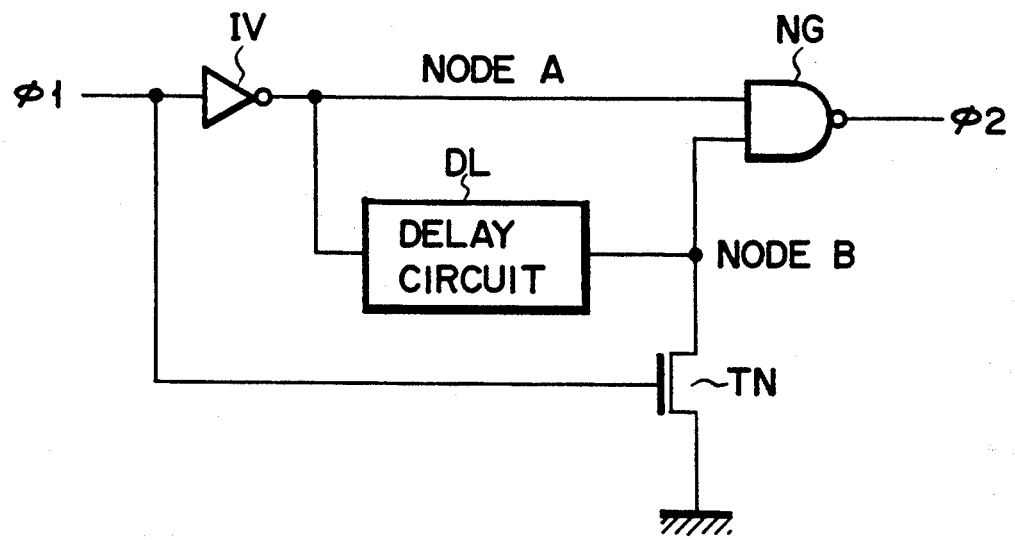
FIG. 22 is a block diagram showing a detailed arrangement of the noise filter shown in FIG. 16.

Note that the noise filter NF is arranged, as shown in, e.g., FIG. 18, 20, or 22.

Figure 19:
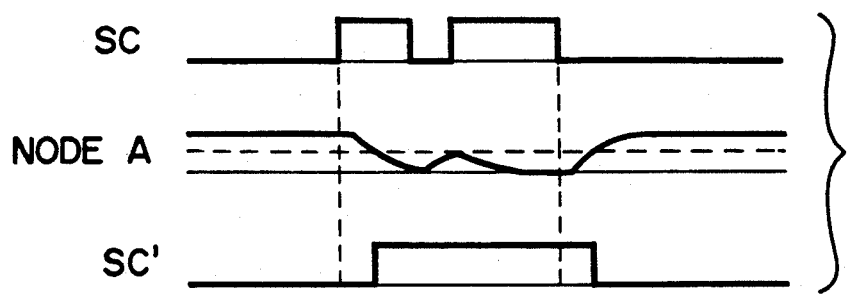
FIG. 19 is a timing chart of the noise filter shown in FIG. 18.

In a noise filter NF shown in FIG. 18, an integrating circuit (delay circuit) DL constituted by a resistor R and a capacitor C is inserted between a first inverter IV1 and a second inverter IV2. FIG. 19 is a timing chart of the noise filter NF. If output noise to temporarily set the clock input SC at "L" from "H" is generated, the potential of an output node of the first inverter IV1 does not perfectly rise, thus suppressing generation of output noise of the clock input SC'. The time when the clock input SC' is output is delayed in comparison to a time when the clock input SC is output. However, as described above, the operation of the shift register is shifted from that of the output data latch circuit by a half period of the clock input, and hence a serial data access time is not adversely affected.

Figure 21:
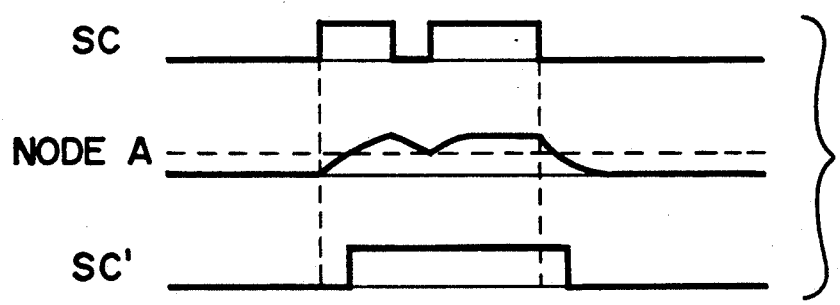
FIG. 21 is a timing chart of the noise filter shown in FIG. 20.

A noise filter NF in FIG. 20 includes a 2-input OR gate for receiving the clock input SC as one input, and a delay circuit DL for delaying the clock input SC by a predetermined period of time to cause the delayed clock input SC to serve as the other input to the 2-input OR gate OR. FIG. 21 is a timing chart of this noise filter NF. Even if output noise to temporarily change the level of the clock input SC from "H" to "L" is generated, generation of output noise due to the clock input SC' can be suppressed only when a delay time of the delay circuit DL is set longer than a pulse width of the output noise.

Figure 23:
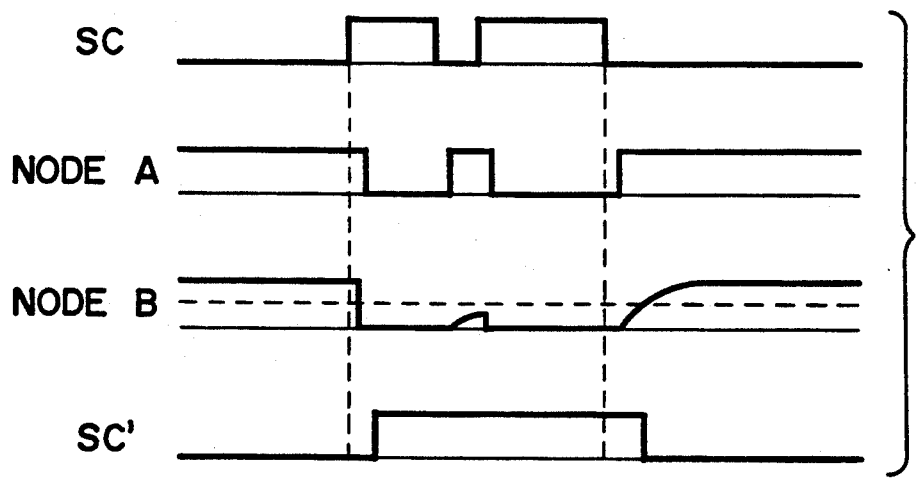
FIG. 23 is a timing chart of the noise filter shown in FIG. 22.

A noise filter NF in FIG. 22 includes an inverter IV for inverting the clock input SC, a 2-input NAND gate NG for receiving an output from the inverter IV as one input, a delay circuit DL for delaying the clock input SC by a predetermined period of time to cause the delayed clock input SC to serve as the other input to the 2-input NAND gate NG, and an n-type MOS transistor TN connected between the output terminal of the delay circuit DL and a ground potential terminal. The transistor TN has a gate for receiving the clock input SC. FIG. 23 is a timing chart of the noise filter NF. Even if output noise to temporarily change the level the clock input SC from "H" to "L" is generated, generation of noise at the output terminal of the delay circuit DL can be suppressed only when a delay time of the delay circuit DL is set longer than a pulse width of the output noise. Therefore, generation of noise due to the clock input SC' can be suppressed.

In addition, the serial input/output section shown in FIG. 13 may be arranged as follows. The noise filters NF is inserted in the SC clock input supply paths to the input latch circuit ILT and to the 1-bit shift registers SR1 to SR4, respectively, and is not inserted in the SC clock input supply path to the output data latch circuit OLT having a data input terminal for receiving the output selected by the last selector Y4. Therefore, a variation in potential of the clock input SC due to output noise can be suppressed without adversely affecting a serial data access time, as in the above arrangement. Therefore, an operation error of the serial output port can be prevented.

What is claimed is:

1. A semiconductor memory having a clock input, comprising:
    n selectors, each respectively having a plurality of data input terminals and a data output terminal, and outputting from its data output terminal, data input from one of said plurality of data input terminals in accordance with a state of a selection control signal;
    (n−1) one-bit shift registers, each having a clock signal input terminal, one data signal input terminal, and an output terminal, said one-bit shift registers being alternately arranged with said n selectors such that a given one of said (n−1) one-bit shift registers receives, at its data signal input terminal, an output from a data output terminal of a selector connected to said data signal input terminal of said given one-bit shift register and supplies an output to a data input terminal (A) of a selector connected to an output terminal of said given one-bit shift register, and said (n−1) one-bit shift registers each being arranged to hold and output data received at its data signal input terminal in an immediately preceding clock input cycle and receive data input at its data signal input terminal when the clock input is set at a first state and to output data received in a second state of the clock input and invalidate data input to its data signal input terminal; and an output data latch circuit, having a clock signal input terminal, and a data input terminal receiving an output selected by a last selector of said n selectors, for outputting data supplied to its data input terminal when the clock input is set in the first state, and holding the output data and invalidating data input to its data input terminal when the clock input is set in the second state, wherein a noise filter is inserted in a clock input supply path to said n one-bit shift registers, and said noise filter is not inserted in a clock input supply path to said output data latch circuit.

2. A semiconductor memory according to claim 1, further comprising n read data latch circuits, each having a read control signal input terminal and one data input terminal, said n read data latch circuits being arranged in correspondence with said n selectors such that each data input terminal of said n read data latch circuits receives a corresponding bit of parallel data, an output from each of said read data latch circuits being input to a data input terminal (B) of the corresponding one of said n selectors, and said read data latch circuits each being arranged to output data supplied to its data input terminal when a read control signal is set in a first state, and to hold the output data and invalidate data input to its data input terminal when the read control signal input is set in a second state.

3. A semiconductor memory having a clock input, comprising:

n selectors, each respectively having a plurality of data input terminals, and selecting, as its output, data input from one of said plurality of data input terminals in accordance with a state of a selection control signal;

n one-bit shift registers, each having a clock signal input terminal and one data signal input terminal, said one-bit shift registers being alternately arranged with said n selectors such that a data input terminal of a first shift register receives serially input write data, a given one of any remaining (n−1) one-bit shift registers receives an output selected by a selector connected to a data signal input terminal of said given one-bit shift register and supplies an output to a data input terminal (A) of a selector connected to an output terminal of said given one-bit shift register, and said remaining (n−1) one-bit shift registers each being arranged to hold and output data received at its data signal input terminal in an immediately preceding clock input cycle and receive data input at its data signal input terminal when the clock input is set in a first state and to output data received in a second state of the clock input and invalidate data input to its data signal input terminal;

an output data latch circuit, having a clock signal input terminal and having a data signal input terminal which receives an output selected by a last selector of said n selectors, said output data latch circuit outputting data supplied to its data signal input terminal when the clock input is set in the first state, and holding the output data and invalidating data input to its data signal input terminal when the clock input is set in the second state;

n read data latch circuits, each having a read control signal input terminal and one data input terminal, said n read data latch circuits being arranged in correspondence with said n selectors such that each data input terminal of said n read data latch circuits receives a corresponding bit of parallel data, an output from each of said read data latch circuits being input to a data input terminal (B) of the corresponding one of said n selectors, and said read data latch circuits each being arranged to output data supplied to its data input terminal when a read control signal input is set in a first state, and to hold the output data and invalidate data input to its data input terminal when the read control signal input is set in a second state; and n write data latch circuits, each having a write control signal input terminal and one data input terminal, said n write data latch circuits being arranged in correspondence with said n one-bit shift registers such that each data input terminal of said n write data latch circuits receives an output from the corresponding one of said n one-bit shift register, and said write data latch circuits each being arranged to output, to a selected memory cell in a memory array, data supplied to its data input terminal when a write control signal input is set in a first state, and to hold the output data and invalidate data input at its data input terminal when the write control signal input is set in a second state.

4. A semiconductor memory according to claim 3, wherein a noise filter is inserted in a clock input supply path to said n one-bit shift register, and said noise filter is not inserted in a clock input supply path to said output data latch circuit.

5. A semiconductor memory having a clock input, comprising:

n selectors, each respectively having a plurality of data input terminals, and selecting, as its output, data input from one of said plurality of data input terminals in accordance with a state of a selection control signal;

n one-bit shift registers, each having a clock signal input terminal and one data signal input terminal, said one-bit shift registers being alternately arranged with said n selectors such that a data input terminal of a first shift register receives serially input write data, a given one of any remaining (n−1) one-bit shift registers receives an output selected by a selector connected to a data signal input terminal of said given one-bit shift register and supplies an output to a data input terminal (A) of a selector connected to an output terminal of said given one-bit shift register, and said remaining (n−1) one-bit shift registers each being arranged to hold and output data received at its data signal input terminal in an immediately preceding clock input cycle and receive data input at its data signal input terminal when the clock input is set in a first state and to output data received in a second state of the clock input and invalidate data input to its data signal input terminal;

an output data latch circuit, having a clock signal input terminal, and having a data signal input terminal which receives an output selected by a last selector of said n selectors, said output data latch circuit outputting data supplied to its data signal input terminal when the clock input is set in the first state, and holding the output data and invalidating data input to its data signal input terminal when the clock input is set in the second state;

n read data latch circuits, each having a red control signal input terminal and one data input terminal, said n read data latch circuits being arranged in correspondence with said n selectors such that each data input terminal of said n read data latch circuits receives a corresponding bit of parallel data, an output from each of said read data latch circuits being input to a data input terminal (B) of the corresponding one of said n selectors, and said read data latch circuits each being arranged to output data supplied to its data input terminal when a read control signal input is set in a first state, and to hold the output data and invalidate data input to its data input terminal when the read control signal input is set in a second state;

n address data latch circuits, each having an address latch control signal input terminal and one address data input terminal, said n address data latch circuits in correspondence with said n one-bit shift registers such that each address data input terminal of said n address data latch circuits receives an output from the corresponding one of said n one-bit shift registers, and said n address data latch circuits each being arranged to output, to an address decoder of said semiconductor memory, data supplied to its address data input terminal when an address latch control signal input is set in a first state, and to hold the output data and invalidate data input to its address data input terminal when the address latch control signal input is set in a second state.

6. A semiconductor memory according to claim 5, wherein a noise filter is inserted in a clock input supply path to said n one-bit shift registers, and said noise filter is not inserted in a clock input supply path to said output data latch circuit.

* * * * *